(12) United States Patent
Zitlaw

(10) Patent No.: US 7,035,966 B2
(45) Date of Patent: *Apr. 25, 2006

(54) PROCESSING SYSTEM WITH DIRECT MEMORY TRANSFER

(75) Inventor: Cliff Zitlaw, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 570 days.

This patent is subject to a terminal disclaimer.

(21) Appl. No.: 09/943,476

(22) Filed: Aug. 30, 2001

(65) Prior Publication Data

US 2003/0046486 A1   Mar. 6, 2003

(51) Int. Cl.
*G06F 12/00* (2006.01)

(52) U.S. Cl. .......................... 711/103; 713/2
(58) Field of Classification Search ............. 711/103; 713/2

See application file for complete search history.

(56) References Cited

U.S. PATENT DOCUMENTS

| | | | |
|---|---|---|---|
| 5,247,643 A | 9/1993 | Shottan | |
| 5,247,648 A | 9/1993 | Watkins et al. | |
| 5,265,235 A | 11/1993 | Sindhu et al. | |
| 5,301,287 A | 4/1994 | Herrell et al. | |
| 5,325,503 A | 6/1994 | Stevens et al. | |
| 5,379,402 A | 1/1995 | Fujihara et al. | |
| 5,408,636 A | 4/1995 | Santeler et al. | |
| 5,410,654 A | 4/1995 | Foster et al. | |
| 5,517,626 A | 5/1996 | Archer et al. | |
| 5,749,092 A | 5/1998 | Heeb et al. | |
| 6,058,474 A * | 5/2000 | Baltz et al. | 713/1 |
| 6,178,467 B1 | 1/2001 | Faucher et al. | |
| 6,266,724 B1 * | 7/2001 | Harari et al. | 710/301 |
| 6,286,088 B1 | 9/2001 | Campbell et al. | |
| 6,546,489 B1 * | 4/2003 | Frank et al. | 713/187 |
| 6,735,669 B1 * | 5/2004 | Shin | 711/106 |

\* cited by examiner

*Primary Examiner*—B. James Peikari
*Assistant Examiner*—Woo H. Choi
(74) *Attorney, Agent, or Firm*—Leffert Jay & Polglaze, P.A.

(57) ABSTRACT

A processing system allows direct data downloads from a non-volatile memory to a volatile memory. During a power-up operation, the volatile memory requests a direct transfer of data from the non-volatile memory. Bypassing a communication bus to a processor, the direct transfer allows for a faster transfer to the volatile memory. Power and capacitive bus loading are also reduced. Once the volatile memory is loaded, a system reset signal is provided from the volatile memory to indicate that the memory is ready.

21 Claims, 2 Drawing Sheets

PROCESSING SYSTEM WITH DIRECT MEMORY TRANSFER

FIELD OF THE INVENTION

The present invention relates generally to data processing systems and in particular the present invention relates to initiation of data processing systems.

BACKGROUND OF THE INVENTION

Processing systems, or computers, typically include a processor and a memory device as internal storage areas for the computer. The term memory identifies data storage that comes in the form of integrated circuit chips. While there are several different types of memory, DRAM (dynamic random-access memory) is traditionally used as the main memory in a computer environment. With the development of different RAM's, a high-speed synchronous-type DRAM is often used with the processor. The dynamic memory, however, cannot retain data in the absence of power. As such, computer system contains some non-volatile storage device. For example, a magnetic storage device or non-volatile memory can be used to store data and software.

During operation, the processor copies data from the non-volatile storage to the dynamic memory. That is, the data from the non-volatile storage is routed via the processor to the dynamic memory. This process consumes power, is time consuming, and consumes processor bandwidth.

For the reasons stated above, and for other reasons stated below which will become apparent to those skilled in the art upon reading and understanding the present specification, there is a need in the art for a system and method of loading a volatile memory during power-up and reset operations in a more efficient manner.

SUMMARY OF THE INVENTION

The above-mentioned problems with processing systems and other problems are addressed by the present invention and will be understood by reading and studying the following specification.

In one embodiment, a processing system comprises a processor, a volatile synchronous memory device coupled to communicate with the processor, and a flash memory device coupled to communicate with the processor and the volatile synchronous memory device. The flash memory device transfers data directly to the synchronous memory device during power-up.

In another embodiment, a processing system comprises a processor, a volatile synchronous memory device coupled to communicate with the processor via a synchronous bus, and a flash memory device coupled to communicate with the processor via a serial bus and communicate with the volatile synchronous memory device via a direct bus. The flash memory device transfers data directly to the volatile synchronous memory device during power-up.

A processor system power-up method comprises detecting a power-up condition and providing a reset signal to a volatile synchronous memory, initiating a direct data transfer from a non-volatile memory to the volatile synchronous memory in response to the reset signal, and providing a system reset signal from the volatile synchronous memory to a processor.

Another processor system power-up method comprises detecting a power-up condition with a reset controller and providing a reset signal to a volatile synchronous memory, using the volatile synchronous memory, initiating a direct data transfer from a flash memory to the synchronous memory in response to the reset signal, and providing a system reset signal from the volatile synchronous memory to a processor after the data has been transferred.

A data transfer method comprises initiating a direct data transfer from a non-volatile memory to a volatile storage device, and transferring data from the non-volatile memory to the volatile storage device without control from an external processor

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
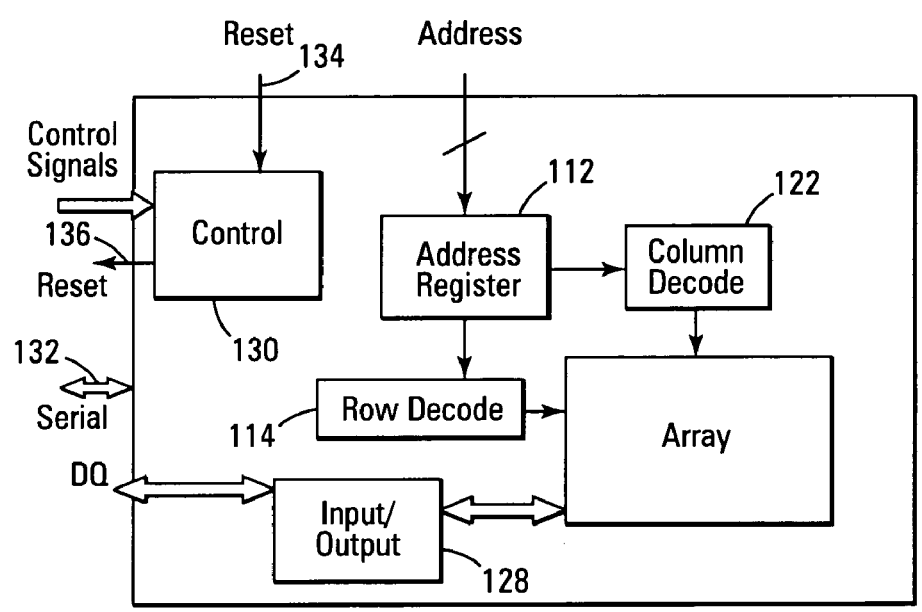
FIG. 1 illustrates a block diagram of a memory device of an embodiment of the present invention.

FIG. 1 illustrates a block diagram of a volatile memory device of an embodiment of the present invention. The memory device 100 includes an array of memory cells 102. In one embodiment, the memory contains multiple memory banks. The data stored in the memory can be accessed using externally provided location addresses received by address register 112. The addresses are decoded using row address decoder circuitry 114. To access an appropriate column of the memory, the received addresses are coupled to column decode circuitry 122. Data is input and output I/O buffer 128. Control 130 is provided to control the basic operations of the memory device. A serial communication port 132 is provided to receive transferred data from a non-volatile storage device, as explained below. The memory has a reset input connection 134 to receive a reset signal used to begin a transfer operation. The memory also includes a reset signal output 136 to provide a reset signal to an external processor to indicate that the transfer is completed.

Figure 2:
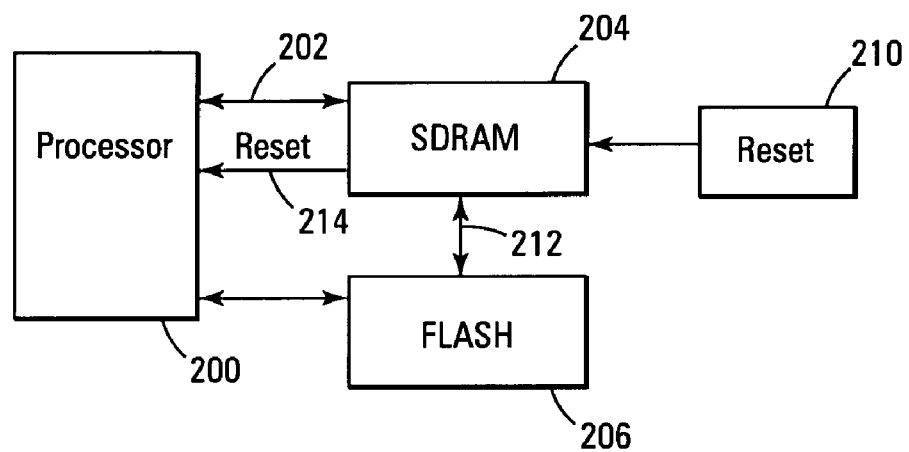
FIG. 2 is a block diagram of a system of the present invention.

Referring to FIG. 2, an embodiment of a processing system of the present invention is described. The system includes a central processing unit (CPU) 200, or processor, that is coupled to a synchronous memory bus 202 and corresponding volatile synchronous DRAM memory(ies) 204. The processor is also coupled to a synchronous flash memory 206. The synchronous DRAM (SDRAM) is coupled to the flash memory for copying data from the flash to the SDRAM during a power-up operation, as explained below. The volatile synchronous memory, in another embodiment, is a Rambus® DRAM (RDRAM). The present invention is not limited to volatile DRAM devices. Other embodiments can include a direct transfer to other volatile memory or storage devices.

A reset controller 210 is coupled to the SDRAM to initiate the memory upon power-up of the system. That is, when power is applied to the system, the reset controller provides a signal to the SDRAM indicating the supply voltage(s) has reached an acceptable level. In response to the reset signal, the SDRAM initiates a data transfer operation from the flash memory. This data transfer operation is direct from the flash to the SDRAM via a direct memory bus 212. After the data transfer is complete, the SDRAM provides a system reset signal 214 to the processor. The system reset signal indicates that the memory is ready for accessing.

In an alternate embodiment, the direct transfer from the non-volatile memory to the volatile storage device can be initiated after power-up. That is, the transfer can be initiated by the controller 200 and/or the volatile device 204 during normal operation periods.

The present invention allows the non-volatile memory contents to be directly loaded into the SDRAM without intervention by the processor. The processor, however, can be used to load and update the data in the flash memory. The flash memory of one embodiment can include features of a synchronous flash device, as described in U.S. patent application Ser. No. 09/627,682 filed Jul. 28, 2000 and incorporated herein by reference. By directly loading the volatile memory, the overall system performance is improved. That is, the volatile memory is loaded faster than prior systems that use the processor to download the flash to the volatile memory. Further, less power is consumed by eliminating the processor from the data transfer operation. Isolating the non-volatile memory also reduces capacitive loading of the synchronous bus. As such, operating speeds of the synchronous bus may be increased.

CONCLUSION

A processing system has been described that allows direct data downloads from a non-volatile memory to volatile memory. During a power-up operation, the synchronous memory requests a direct transfer of data from the flash memory. Bypassing the synchronous communication bus allows for a faster transfer to the dynamic memory. Power and capacitive bus loading are also reduced. Once the synchronous memory is loaded, a system reset signal is provided to indicate that the memory is read.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A processing system comprising:
a processor;
a volatile memory device coupled to communicate with the processor over a synchronous first bus; and
a non-volatile memory device coupled to the processor over a serial second bus and connected to the volatile memory device over a dedicated third bus that connects only the volatile memory to the non-volatile memory, wherein the non-volatile memory device transfers data directly to the volatile memory device during power-up without intervention or control by any other device.

2. The processing system of claim 1 wherein the volatile memory device initiates the data transfer in response to a reset signal.

3. The processing system of claim 1 wherein the volatile memory device provides a system reset signal to the processor after the data is transferred from the non-volatile memory device.

4. The processing system of claim 1 wherein the processor is coupled to store data in the non-volatile memory device via a serial bus.

5. The processing system of claim 1 wherein the volatile memory device initiates the data transfer in response to a reset signal provided by an external reset controller.

6. A processing system comprising:
a processor;
a synchronous memory device coupled to communicate with the processor via a synchronous first bus; and
a flash memory device coupled to communicate with the processor via a serial second bus and connected to the synchronous memory device via a dedicated direct third bus that connects only the synchronous memory device and the flash memory device, wherein the flash memory device transfers data directly to the synchronous memory device during power-up without intervention or control by any other device.

7. The processing system of claim 6 wherein the synchronous memory device initiates the data transfer in response to a reset signal provided by an external reset controller.

8. The processing system of claim 7 wherein the synchronous memory device provides a system reset signal to the processor after the data is transferred from the flash memory device.

9. The processing system of claim 6 wherein the synchronous memory device is an SDRAM.

10. The processing system of claim 6 wherein the synchronous memory device is an RDRAM.

11. A processor system power-up method, in a system having a processor coupled to a synchronous memory over a synchronous first bus and a non-volatile memory device over a serial second bus, the synchronous memory connected to the non-volatile memory device over a dedicated third bus that connects only the synchronous memory and the non-volatile memory device, the method comprising:
detecting a power-up condition and providing a reset signal to the synchronous memory;
initiating a direct data transfer from the non-volatile memory to the synchronous memory over the dedicated third bus, without intervention from any other device, in response to the reset signal; and
providing a system reset signal from the synchronous memory to the processor upon completion of the direct data transfer.

12. The method of claim 11 wherein the synchronous memory device is an SDRAM.

13. The method of claim 11 wherein the synchronous memory device is an RDRAM.

14. The method of claim 11 wherein the non-volatile memory is flash memory.

15. The method of claim 11 further comprises loading the non-volatile memory with the processor prior to detecting the power-up condition.

16. A method of improving a processor system power-up, in a system having a processor coupled to a synchronous memory over a synchronous first bus and a flash memory device over a serial second bus, the synchronous memory connected to the flash memory device over a dedicated third bus that connects only the synchronous memory and the flash memory device, the method comprising:
detecting a power-up condition with a reset controller and providing a reset signal to the synchronous memory;

using the synchronous memory, initiating a direct data transfer from the flash memory to the synchronous memory, over a dedicated bus and without intervention or control, in response to the reset signal; and providing a system reset signal from the synchronous memory to the processor after the data has been transferred.

17. The method of claim 16 wherein the synchronous memory is coupled to the processor via a synchronous bus.

18. The method of claim 16 wherein the synchronous memory device is either an SDRAM or an RDRAM.

19. A method of increasing a processor system power-up speed, in a system having a processor coupled to a synchronous dynamic random access memory (SDRAM) over a synchronous first bus and a flash memory device over a serial second bus, the SDRAM connected to the flash memory device over a dedicated third bus that connects only the SDRAM and the flash memory device, the method comprising:

detecting a power-up condition with a reset controller and providing a reset signal to the SDRAM;

using the SDRAM, initiating a direct data transfer from the flash memory to the synchronous memory, over a dedicated bus and without intervention or control, in response to the reset signal; and providing a system reset signal from the SDRAM to the processor after the data has been transferred.

20. A processor system power-up method, in a system having a processor coupled to a rambus dynamic random access memory (RDRAM) over a synchronous first bus and a flash memory device over a serial second bus, the RDRAM connected to the flash memory device over a dedicated third bus that connects only the RDRAM and the flash memory device, the method comprising:

detecting a power-up condition with a reset controller and providing a reset signal to the RDRAM;

using the RDRAM, initiating a direct data transfer from the flash memory to the synchronous memory, over a dedicated bus and without intervention or control, in response to the reset signal; and providing a system reset signal from the RDRAM to the processor after the data has been transferred.

21. A data transfer method, in a system having a processor coupled to a volatile storage device over a synchronous first bus and a non-volatile memory over a serial second bus, the volatile storage device connected to the non-volatile memory over a dedicated third bus that connects only the volatile storage device and the non-volatile memory, the method comprising:

initiating a direct data transfer from the non-volatile memory to the volatile storage device over the dedicated third bus; and transferring data from the non-volatile memory to the volatile storage device without intervention or control from any other device.

* * * * *